(12) United States Patent
Downey

(10) Patent No.: US 7,163,901 B2
(45) Date of Patent: Jan. 16, 2007

(54) METHODS FOR FORMING THIN FILM LAYERS BY SIMULTANEOUS DOPING AND SINTERING

(75) Inventor: Daniel F. Downey, Magnolia, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/096,732

(22) Filed: Mar. 13, 2002

(65) Prior Publication Data

US 2003/0181068 A1 Sep. 25, 2003

(51) Int. Cl.
*H01L 21/469* (2006.01)
*H01L 21/31* (2006.01)

(52) U.S. Cl. .............. 438/785; 438/287; 438/514; 438/530; 257/E21.193; 257/E21.268; 257/E21.274

(58) Field of Classification Search ............... 438/513, 438/514, 522, 530, 768, 769, 771, 776, 287, 438/785
See application file for complete search history.

(56) References Cited

U.S. PATENT DOCUMENTS

| 4,704,302 A | * | 11/1987 | Bruel et al. ............. 427/38 |
| 4,764,394 A | | 8/1988 | Conrad |
| 5,019,752 A | | 5/1991 | Schumacher |
| 5,212,425 A | | 5/1993 | Goebel et al. |
| 5,218,179 A | | 6/1993 | Matossian et al. |
| 5,329,205 A | | 7/1994 | Goebel et al. |
| 5,330,800 A | | 7/1994 | Schumacher et al. |
| 5,354,381 A | | 10/1994 | Sheng |
| 5,516,707 A | | 5/1996 | Loh et al. |
| 5,711,812 A | | 1/1998 | Chapek et al. |
| 5,897,363 A | | 4/1999 | Gonzalez et al. |
| 5,930,606 A | | 7/1999 | McCulloch |

(Continued)

FOREIGN PATENT DOCUMENTS

| EP | 0824268 | * | 2/1998 |
| EP | 0824268 A2 | | 2/1998 |
| EP | 0973189 A2 | | 1/2000 |
| WO | WO 00/65631 A2 | | 11/2000 |
| WO | WO 02/17372 A1 | | 2/2002 |

OTHER PUBLICATIONS

Huff et al., "The Gate Stack/Shallow Junction Challenge for Sub-100 nm Technology Generations" Electrochemical Society Proceedings; 2001-2, pp. 223-241.

(Continued)

*Primary Examiner*—Alexander Ghyka
(74) *Attorney, Agent, or Firm*—Varian Semiconductor Equipment Associates, Inc.

(57) ABSTRACT

A method is provided for forming a thin film layer on a substrate. The method includes the steps of doping a thin surface layer on the substrate with low energy ions of a dopant material, and heating the thin surface layer sufficiently to produce a reaction between the dopant material and the surface layer. The heating step is performed simultaneously with at least part of the doping step. The doping step may utilize plasma doping of the thin surface layer. In one embodiment, the doping step includes plasma doping of a silicon oxide layer with nitrogen ions. The heating step may utilize thermal conduction or heating with radiation, such as heating with optical energy. The process may be used for forming dielectric layers having a thickness of 50 angstroms or less.

16 Claims, 3 Drawing Sheets

U.S. PATENT DOCUMENTS

| | | | |
|---|---|---|---|
| 6,013,566 | A | 1/2000 | Thakur et al. |
| 6,069,054 | A | 5/2000 | Choi |
| 6,127,238 | A | 10/2000 | Liao et al. |
| 6,168,980 | B1 | 1/2001 | Yamazaki et al. |
| 6,214,707 | B1 * | 4/2001 | Thakur et al. .............. 438/513 |
| 6,268,296 | B1 | 7/2001 | Misium et al. |
| 6,309,959 | B1 * | 10/2001 | Wang et al. ................ 438/625 |
| 2001/0021588 | A1 | 9/2001 | Misium et al. |

OTHER PUBLICATIONS

Iwai and Ohmi, "ULSI Process Integration for 2005 and beyond", Electrochemical Society Proceedings; 2001-2, pp. 3-33.

Ito et al., "Flash Lamp Anneal Technology for Effectively Activating Ion Implanted Si", Int'l Conf. on Solid State Devices and Materials; Tokyo, (2001) pp. 182-183.

"Difficult Challenges—The Front End Processes Grand Challenge", The International Technology Roadmap For Semiconductors: 2001, pp. 2-5 and 19-29.

* cited by examiner

METHODS FOR FORMING THIN FILM LAYERS BY SIMULTANEOUS DOPING AND SINTERING

FIELD OF THE INVENTION

This invention relates to methods for forming thin film layers on substrates, such as semiconductor wafers, and, more particularly, to methods for forming thin film layers by simultaneous doping and sintering. The invention is particularly useful for forming dielectric layers having a thickness of 50 angstroms or less, but is not limited to this application.

BACKGROUND OF THE INVENTION

A well-known trend in the semiconductor industry is toward smaller, higher speed devices. In particular, both the lateral dimensions and the depths of features in semiconductor devices are decreasing. State of the art semiconductor devices require junction depths less than 1,000 angstroms and may eventually require junction depths on the order of 200 angstroms or less.

One critical element in the trend toward increased miniaturization is the gate structure of MOS transistors. A dielectric layer overlays the channel, and the gate electrode is disposed on the dielectric layer. Prior art devices have typically utilized a silicon dioxide gate dielectric.

As device dimensions decrease and operating speeds increase, the thickness of the gate dielectric must be reduced. However, below a thickness of about 1.5 nanometers, processing difficulties are encountered and leakage current may be unacceptable. One proposed solution to this problem involves the formation of dielectric layers having higher dielectric constants. For example, silicon nitride and silicon oxynitride dielectric layers have been utilized, and zirconium and hafnium oxide dielectric layers have been proposed. See for example, Hiroshi Iwai et al, "ULSI Process Integration for 2005 and beyond", Electrochemical Society Proceedings Volume 2001-2, pages 3–33 and Howard R. Huff et al, "The Gate Stack/Shallow Junction Challenge for Sub-100 nm Technology Generations", Electrochemical Society Proceedings Volume 2001-2, pages 223–241.

Techniques for forming silicon nitride or silicon oxynitride films have included chemical vapor deposition (CVD), remote plasma enhanced chemical vapor deposition (RPECVD), low pressure rapid thermal chemical vapor deposition (RTCVD), jet vapor deposition (JVD), in situ steam generation (ISSG) with remote plasma nitridation (RPN), and reoxidation of silicon nitride in a vertical high pressure (PHP) furnace. In each of these techniques, heating is required to diffuse the nitrogen to the desired depth and to promote a chemical reaction between the nitrogen and the silicon dioxide. However, the required heating may cause diffusion of the nitrogen beyond the thin dielectric layer and may cause undesired diffusion of other doped materials in the device being fabricated.

Accordingly, there is a need for improved methods for forming ultra thin dielectric layers and metallic layers.

SUMMARY OF THE INVENTION

According to a first aspect of the invention, a method is provided for forming a thin film layer on a substrate. The method comprises the steps of doping a thin surface layer on the substrate with low energy ions of a dopant material, and heating the thin surface layer sufficiently to produce a reaction between the dopant material and the surface layer to form a dielectric film, a metal film or a silicide film having a thickness of 50 angstroms or less. The heating step is performed simultaneously with at least part of the doping step.

In some embodiments, the step of doping a thin surface layer comprises plasma doping of the thin surface layer. In other embodiments, the step of doping a thin surface layer comprises beamline ion implantation of the thin surface layer.

The thin surface layer may be doped with nitrogen, hafnium, zirconium, and combinations thereof. In some embodiments, the thin surface layer comprises a silicon oxide film. In other embodiments, the thin surface layer comprises a metal film. In further embodiments, the thin surface layer comprises a silicide film. In a preferred embodiment, the step of doping a thin surface layer comprises plasma doping a silicon oxide layer with nitrogen.

The thin film layer may have a thickness of 50 angstroms or less. In some embodiments, the thin surface layer has a thickness of 30 angstroms or less. In other embodiments, the thin surface layer has a thickness of 20 angstroms or less.

In some embodiments, the step of heating the thin surface layer comprises heating by conduction. For example, a support member on which the substrate is mounted may be heated. In other embodiments, the thin surface layer may be heated by radiation, such as by heating with optical energy. The thin surface layer may be heated to a temperature in a range of about 400° C. to about 700° C.

In a preferred embodiment, the reaction between the dopant material and the thin surface layer forms a dielectric layer having a high dielectric constant.

According to another aspect of the invention, a method is provided for forming a thin film layer on a silicon substrate. The method comprises the steps of plasma doping a thin surface layer of silicon oxide on the substrate with low energy nitrogen ions to form a doped silicon oxide layer and heating the doped silicon oxide layer sufficiently to produce a reaction between the nitrogen ions and the silicon oxide to thereby form silicon nitride, silicon oxynitride, or both. The heating step is performed simultaneously with at least part of the plasma doping step. The heating is preferably performed for a time and at a temperature that does not produce significant diffusion of the nitrogen ions.

BRIEF DESCRIPTION OF THE DRAWINGS

For better understanding the present invention, reference is made to the accompanying drawings, which are incorporated herein by reference and in which.

DETAILED DESCRIPTION

Figure 1:
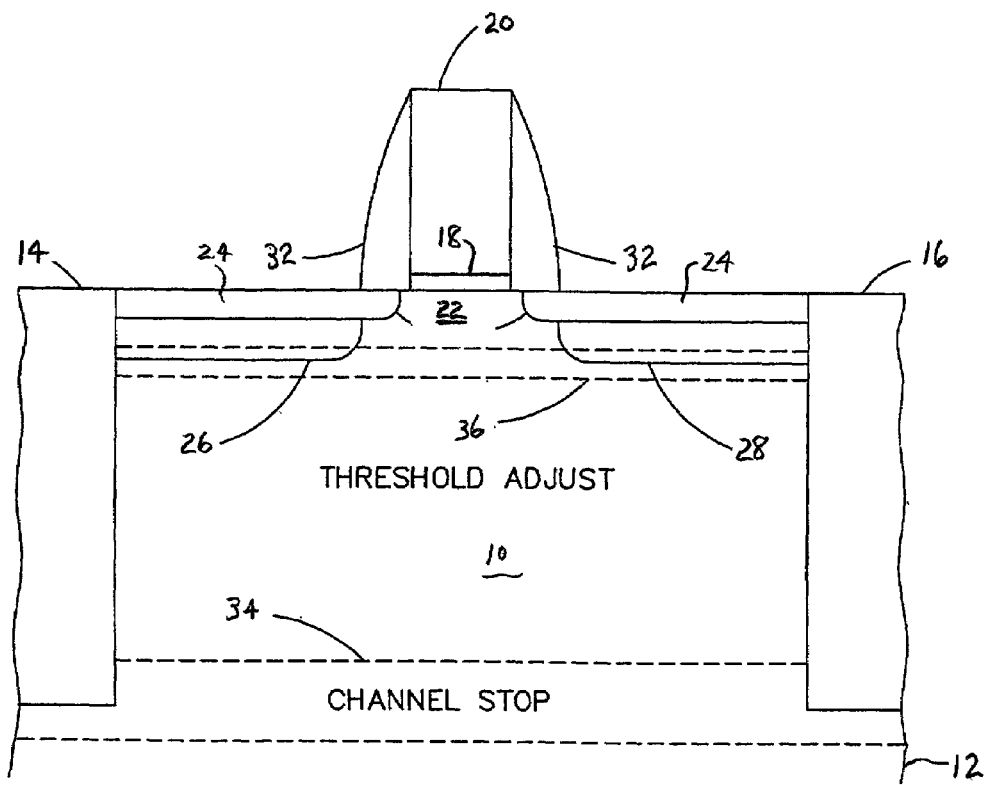
FIG. 1 is a simplified cross-sectional diagram of a typical MOS transistor.

An enlarged cross-sectional view of an example of an MOS device is shown in FIG. 1. It will be understood that FIG. 1 is simplified and is not drawn to scale. A well 10 (p-well or n-well) is formed in a silicon substrate 12 between isolation regions 14 and 16. A gate electrode 20 is formed over a channel 22. Gate electrode 20 is electrically isolated from channel 22 by a gate dielectric layer 18. Relatively shallow source/drain extensions 24 extend from opposite ends of channel 22 to relatively deep source and drain regions 26 and 28, respectively. A sidewall spacer 32 on the sides of gate electrode 20 facilitates implantation of source and drain regions 26 and 28. The MOS device may further include a channel stop 34 and a threshold adjust 36. A typical CMOS integrated circuit formed on substrate 12 includes multiple n-type MOS devices and multiple p-type MOS devices in a CMOS configuration, as known in the art.

As noted above, devices with reduced dimensions and increased operating speeds require that dielectric layer 18 be extremely thin and may require that the dielectric layer have a high dielectric constant. Prior art techniques for forming dielectric layers are not satisfactory for forming ultra thin layers. Such layers may be required to have thicknesses of 50 angstroms or less.

According to an aspect of the invention, a method is provided for forming a thin film layer on a substrate. The method includes the steps of doping a thin surface layer on the substrate with low energy ions of a dopant material, and heating the thin surface layer sufficiently to produce a reaction between the dopant material and the surface layer. The heating step is performed simultaneously with at least part of the doping step. The doping of the thin surface layer may be performed by plasma doping or by ion implantation with a beamline ion implanter, for example. The heating step may be performed by thermal conduction to the substrate, such as by heating a support member on which the substrate is mounted, or by radiation, such as by heating with a lamp or other source of optical energy.

The thin film layer which results from the process of the invention may be a dielectric layer, a doped metal layer or a doped silicide layer. The thin film layer has a thickness of 50 angstroms or less. In some embodiments, the thin film layer has a thickness of 30 angstroms or less, and in further embodiments, the thin film layer has a thickness of 20 angstroms or less.

A variety of surface layer materials and dopant materials may be utilized. By way of example, the surface layer may be a silicon oxide film, a metal film or a silicide film. Also, by way of example, the dopant material may be nitrogen, hafnium or zirconium. In one specific example, a silicon oxide layer may be doped with nitrogen ions to form a silicon nitride or silicon oxynitride dielectric layer.

Figure 2:
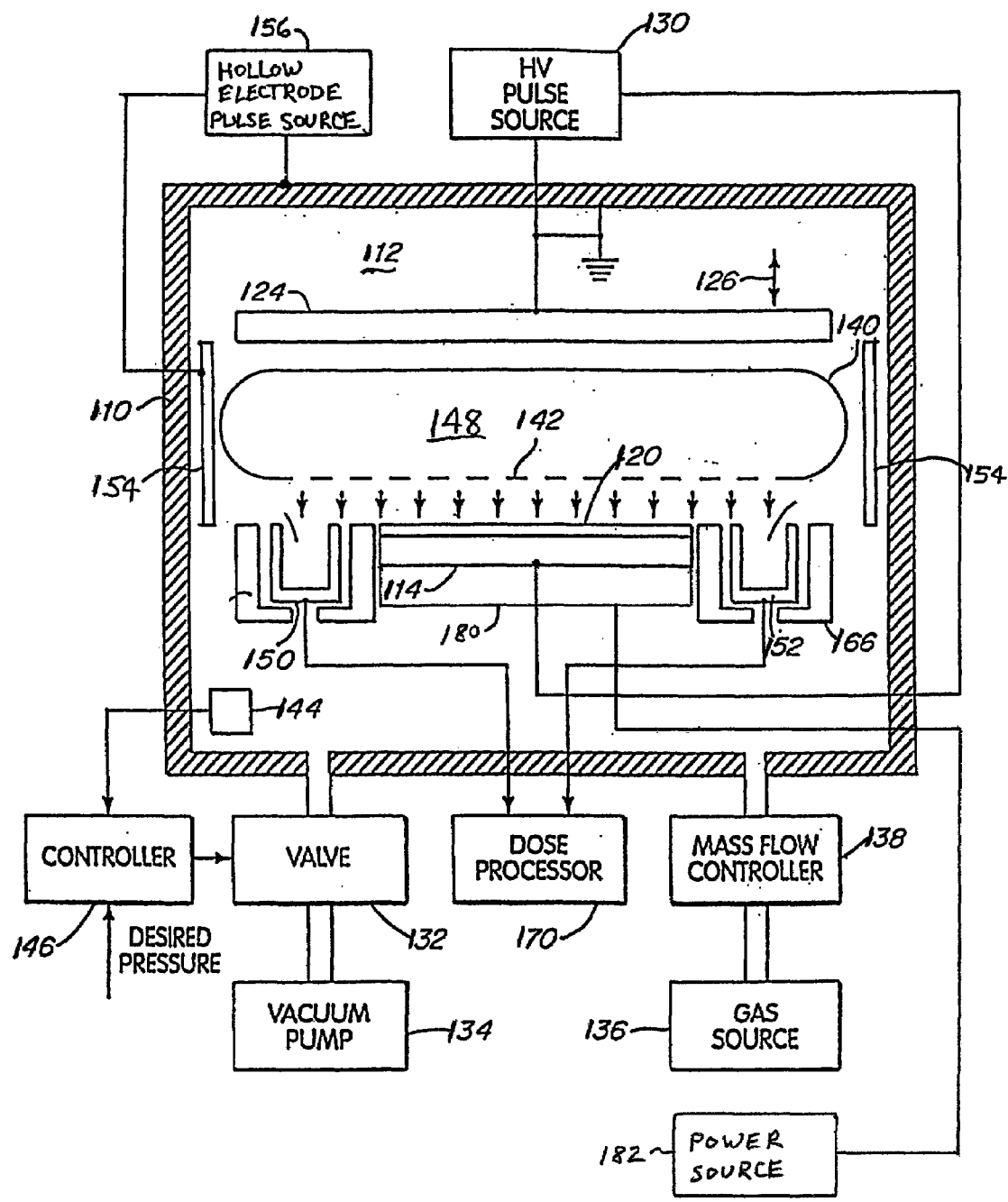
FIG. 2 is a schematic block diagram of a plasma doping system incorporating controlled heating of the substrate.

An example of a plasma doping system suitable for practicing the present invention is shown schematically in FIG. 2. A plasma doping chamber 110 defines an enclosed volume 112. A platen 114 positioned within chamber 110 provides a surface for holding a workpiece, such as a semiconductor wafer 120. The wafer 120 may, for example, be clamped at its periphery to a flat surface of platen 114. In one embodiment, the platen has an electrically conductive surface for supporting wafer 120. In another embodiment, the platen includes conductive pins (not shown) for connection to wafer 120. In a further embodiment, the platen includes an electrostatic wafer clamp.

An anode 124 is positioned within chamber 110 in spaced relation to platen 114. Anode 124 may be movable in a direction, indicated by arrow 126, perpendicular to platen 114. The anode is typically connected to electrically conductive walls of chamber 110, both of which may be connected to ground. In another embodiment, platen 114 is connected to ground, and anode 124 is pulsed.

The wafer 120 (via platen 114) and the anode 124 are connected to a high voltage pulse source 130, so that wafer 120 functions as a cathode. The pulse source 130 typically provides pulses in a range of about 100 to 5,000 volts in amplitude, about 1 to 50 microseconds in duration and a pulse repetition rate of about 100 Hz to 2 kHz. It will be understood that these pulse parameter values are given by way of example only and that other values may be utilized within the scope of the invention.

The enclosed volume 112 of chamber 110 is coupled through a controllable valve 132 to a vacuum pump 134. A process gas source 136 is coupled through a mass flow controller 138 to chamber 110. A pressure sensor 144 located within chamber 110 provides a signal indicative of chamber pressure to a controller 146. The controller 146 compares the sensed chamber pressure with a desired pressure input and provides a control signal to valve 132. The control signal controls valve 132 so as to minimize the difference between the sensed chamber pressure and the desired pressure. Vacuum pump 134, valve 132, pressure sensor 144 and controller 146 constitute a closed loop pressure control system. The pressure is typically controlled in a range of about 1 millitorr to about 500 millitorr, but is not limited to this range. Gas source 136 supplies an ionizable gas containing a desired dopant for implantation into the workpiece. Examples of ionizable gas include $BF_3$, $N_2$, Ar, $PH_3$, $AsH_3$ and $B_2H_6$. Mass flow controller 138 regulates the rate at which process gas is supplied to chamber 110. The configuration shown in FIG. 2 provides a continuous flow of process gas at a constant gas flow rate and constant pressure. The pressure and gas flow are preferably regulated to provide repeatable results.

The plasma doping system may include a hollow cathode 154 connected to a hollow cathode pulse source 156. In one embodiment, the hollow cathode 154 comprises a conductive hollow cylinder that surrounds the space between anode 124 and platen 114. The hollow cathode may be utilized in applications which require very low ion energies.

One or more Faraday cups may be positioned adjacent to platen 114 for measuring the ion dose implanted into wafer 120. In the embodiment of FIG. 2, Faraday cups 50, 52, etc. are equally spaced around the periphery of wafer 120. In another embodiment, an annular Faraday cup is positioned around wafer 120 and platen 114. The Faraday cups are electrically connected to a dose processor 170 or other dose monitoring circuit. The plasma doping system may further include a guard ring 166 that surrounds platen 114. The guard ring 166 may be biased to improve the uniformity of implanted ion distribution near the edge of wafer 120.

The plasma doping system may further include a heating element 180 in thermal contact with platen 114. The heating element 180 is connected to a power source 182. When the power source 182 is energized, the heating element 180 heats platen 114 and wafer 120.

In operation, wafer 120 is positioned on platen 114. The pressure control system, mass flow controller 138 and gas source 136 produce the desired pressure and gas flow rate within chamber 110. The pulse source 130 applies a series of high voltage pulses to wafer 120, causing formation of a plasma 140 in a plasma discharge region 148 between wafer 120 and anode 124. As known in the art, plasma 140 contains positive ions of the ionizable gas from gas source 136 and includes a plasma sheath 142 in the vicinity, typically at the surface, of wafer 120. The electric field that is present between anode 124 and platen 114 during the high voltage pulse accelerates positive ions from plasma 140 across plasma sheath 142 toward platen 114. The accelerated ions are implanted into wafer 120 to form regions of dopant material. The pulse voltage is selected to implant the positive ions to a desired depth. The number of pulses and the pulse duration are selected to provide a desired dose of dopant material in wafer 120. The power source 182 is energized for a selected time and to produce a desired temperature of wafer 120 during all or part of the plasma doping process.

As described above, a method for forming a thin film layer on a substrate in accordance with an aspect of the invention includes doping a thin surface layer with low energy ions of a dopant material and heating the thin surface layer sufficiently to produce a reaction between the dopant material and the surface layer. The heating step is performed simultaneously with at least part of the doping step.

Referring to FIG. 2, gas source 136 supplies a gas containing the dopant material to chamber 110. Examples of suitable dopant materials for forming a dielectric layer include, but are not limited to, nitrogen, hafnium and zirconium. Combinations of these and other dopant materials may also be utilized. The dopant material reacts with the surface layer to produce a dielectric layer having a higher dielectric constant than the undoped layer. The gas is ionized in plasma 40, and the ions are implanted into a thin layer on the surface of wafer 120. The thin surface layer may, for example, be a silicon oxide film. The voltage of pulse source 30 is adjusted to implant the ions of the dopant material to a desired depth into the surface layer. The implant energy and hence the implant depth is selected to match or nearly match the desired thickness of the thin film layer being produced. The depth is typically in a range of 50 angstroms or less, thus requiring very low energies.

During implantation of the dopant material, power source 182 is energized, causing heating of wafer 120 and the thin surface layer. The heating is sufficient to produce a reaction between the dopant material and the surface layer. For example, where the surface layer is silicon oxide and the dopant material is nitrogen, the reaction produces silicon nitride and/or silicon oxynitride. The time and temperature of the heating step are selected to avoid significant diffusion of the dopant material beyond the surface layer. By way of example, the thin surface layer may be heated to a temperature in a range of about 400° C. to about 700° C. for a time in a range of about 10 to 300 seconds. It will be understood that different times and temperatures may be utilized for different combinations of materials.

The heating step is performed simultaneously with at least part of the doping step. The heating step may be shorter in duration than the doping step, may be equal in duration to the doping step, or may continue after the doping step has been completed.

It will be understood that different heating techniques may be utilized. In the example of FIG. 2, wafer 120 is heated by conduction through platen 114. In other approaches, the thin surface layer may be heated by radiation, such as by optical energy. Techniques for heating wafers with lamps and other sources of optical energy are well known to those skilled in the art.

Figure 3:
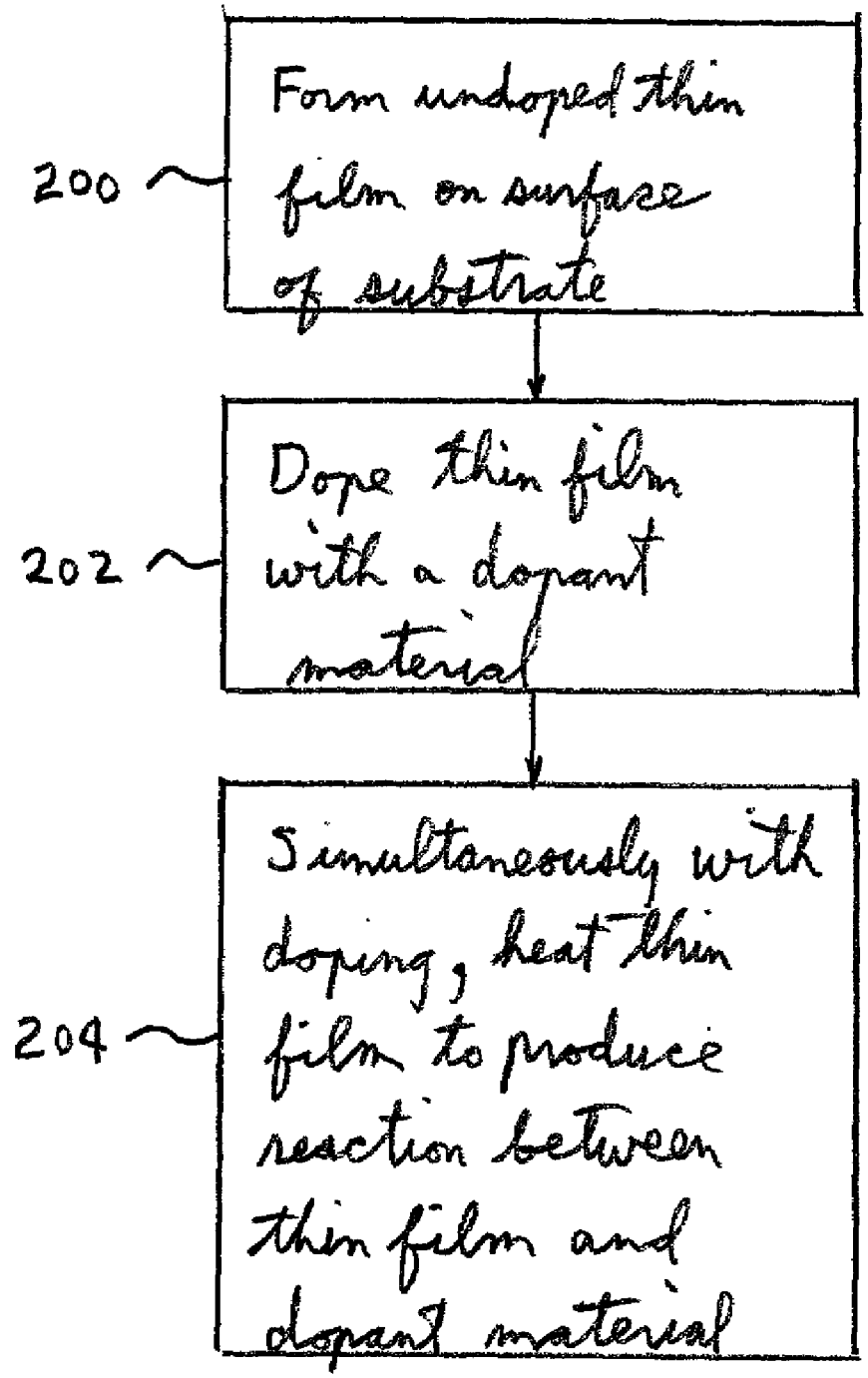
FIG. 3 is a flow diagram of a process for forming thin film layers in accordance with an embodiment of the invention.

The process has been described thus far in connection with the formation of thin dielectric layers. However, the process may be utilized for formation of metal films, silicide films and other types of thin films. The process is summarized in the flow diagram of FIG. 3. In step 200, an undoped thin film is formed on the surface of the substrate. The thin film may be formed, for example, by oxidation of the substrate material or by chemical vapor deposition (CVD). In step 202, the thin film is doped with low energy ions of a dopant material, such as by plasma doping or ion implantation. Simultaneously with all or part of the doping step, the thin film is heated in step 204 to produce a reaction between the thin film material and the dopant material. The reaction produces the desired thin film layer, such as a dielectric layer. The parameters of the heating are selected to produce the reaction between the thin film material and the dopant material, while avoiding significant diffusion of the dopant material beyond the thin film.

The above description is intended to be illustrative and not exhaustive. The description will suggest many variations and alternatives to one of ordinary skill in this art. All these alternatives and variations are intended to be included within the scope of the attached claims. Those familiar with the art may recognize other equivalents to be specific embodiments described herein which equivalents are also intended to be encompassed by the claims attached hereto. Further, the particular features presented in the independent claims below can be combined with each other in other manners within the scope of the invention such that the invention should be recognized as also specifically directed to other embodiments having any other possible combination of the features of the dependent claims.

What is claimed:

1. A method for forming a thin film layer on a substrate, comprising the steps of:
    doping a thin surface layer on the substrate with low energy ions of a dopant material; and
    simultaneously heating with at least part of the doping step the thin surface layer for a predetermined heating time within a predetermined temperature range to produce a chemical reaction between the dopant material and the surface layer without significant diffusion of the dopant material to form a dielectric film, a metal film or a suicide film having a thickness of 50 angstroms or less, wherein the step of doping the thin surface layer comprises doping with hafnium.

2. A method for forming a thin film layer on a substrate, comprising the steps of:
    doping a thin surface layer on the substrate with low energy ions of a dopant material; and
    simultaneously heating with at least part of the doping step the thin surface layer for a predetermined heating time within a predetermined temperature range to produce a chemical reaction between the dopant material and the surface layer without significant diffusion of the dopant material to form a dielectric film, a metal film or a silicide film having a thickness of 50 angstroms or less, wherein the step of doping the thin surface layer comprises doping with zirconium.

3. A method as defined in claim 1, wherein the step of doping the thin surface layer comprises plasma doping of the thin surface layer.

4. A method as defined in claim 1, wherein the step of doping the thin surface layer comprises ion implantation of the thin surface layer.

5. A method as defined in claim 1, wherein the step of doping the thin surface layer comprises doping a silicon oxide layer.

6. A method as defined in claim 1, wherein the step of doping the thin surface layer comprises doping the thin surface layer having a thickness of 30 angstroms or less.

7. A method as defined in claim 1, wherein the step of doping a thin surface layer comprises doping a thin surface layer having a thickness of 20 angstroms or less.

8. A method as defined in claim 1, wherein the step of heating the thin surface layer comprises heating a support member on which the substrate is mounted.

9. A method as defined in claim 1, wherein the step of heating the thin surface layer comprises heating for the predetermined heating time and at the temperature range that does not produce significant diffusion of the dopant material.

10. A method as defined in claim 2, wherein the step of doping the thin surface layer comprises plasma doping of the thin surface layer.

11. A method as defined in claim 2, wherein the step of doping the thin surface layer comprises ion implantation of the thin surface layer.

12. A method as defined in claim 2, wherein the step of doping the thin surface layer comprises doping a silicon oxide layer.

13. A method as defined in claim 2, wherein the step of doping the thin surface layer comprises doping the thin surface layer having a thickness of 30 angstroms or less.

14. A method as defined in claim 2, wherein the step of doping the thin surface layer comprises doping a thin surface layer having a thickness of 20 angstroms or less.

15. A method as defined in claim 2, wherein the step of heating the thin surface layer comprises heating a support member on which the substrate is mounted.

16. A method as defined in claim 2, wherein the step of heating the thin surface layer comprises heating for the predetermined heating time and at the temperature range that does not produce significant diffusion of the dopant material.

* * * * *